(12) United States Patent
Yokosyo

(10) Patent No.: US 11,101,793 B2
(45) Date of Patent: Aug. 24, 2021

(54) DRIVE CIRCUIT

(71) Applicant: DENSO CORPORATION, Kariya (JP)

(72) Inventor: Tatsuya Yokosyo, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/872,763

(22) Filed: May 12, 2020

(65) Prior Publication Data

US 2020/0366286 A1    Nov. 19, 2020

(30) Foreign Application Priority Data

May 15, 2019   (JP) .............................. JP2019-092392

(51) Int. Cl.
*H03K 17/687*   (2006.01)
*H03K 17/082*   (2006.01)
*H02H 7/08*     (2006.01)
*H03K 17/0812*  (2006.01)

(52) U.S. Cl.
CPC ......... *H03K 17/687* (2013.01); *H02H 7/0833* (2013.01); *H03K 17/0812* (2013.01); *H03K 17/0822* (2013.01)

(58) Field of Classification Search
None
See application file for complete search history.

(56) References Cited

U.S. PATENT DOCUMENTS

2012/0224288 A1*  9/2012  Uota ................. H03K 17/0828
                                                    361/79
2019/0058388 A1   2/2019  Tsubamoto et al.

* cited by examiner

*Primary Examiner* — Cassandra F Cox
(74) *Attorney, Agent, or Firm* — Oliff PLC

(57) ABSTRACT

A drive circuit for driving a switching element on a SiC substrate, includes: a comparator for comparing a current flowing through the switching element with an overcurrent threshold; a determination unit for determining whether an overcurrent flows, based on a comparison result; a control unit for generating a drive signal for controlling a drive operation of the switching element based on a drive command, and for turning off the switching element when determining that the overcurrent flows; and a setting unit for variably setting the overcurrent threshold according to a physical quantity correlated with a voltage between main electrodes of the switching element.

12 Claims, 5 Drawing Sheets

DRIVE CIRCUIT

CROSS REFERENCE TO RELATED APPLICATION

The present application claims the benefit of priority from Japanese Patent Application No. 2019-092392 filed on May 15, 2019. The entire disclosure of the above application is incorporated herein by reference.

TECHNICAL FIELD

The present disclosure relates to a drive circuit for a switching element.

BACKGROUND

A conceivable drive circuit compares a current flowing through a switching element with an overcurrent threshold (corresponding to a reference voltage). When the current is equal to or greater than the overcurrent threshold, the drive circuit determines that an overcurrent is flowing, and turns off the switching element.

SUMMARY

According to an example embodiment, a drive circuit for driving a switching element on a SiC substrate, includes: a comparator for comparing a current flowing through the switching element with an overcurrent threshold; a determination unit for determining whether an overcurrent flows, based on a comparison result; a control unit for generating a drive signal for controlling a drive operation of the switching element based on a drive command, and for turning off the switching element when determining that the overcurrent flows; and a setting unit for variably setting the overcurrent threshold according to a physical quantity correlated with a voltage between main electrodes of the switching element.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
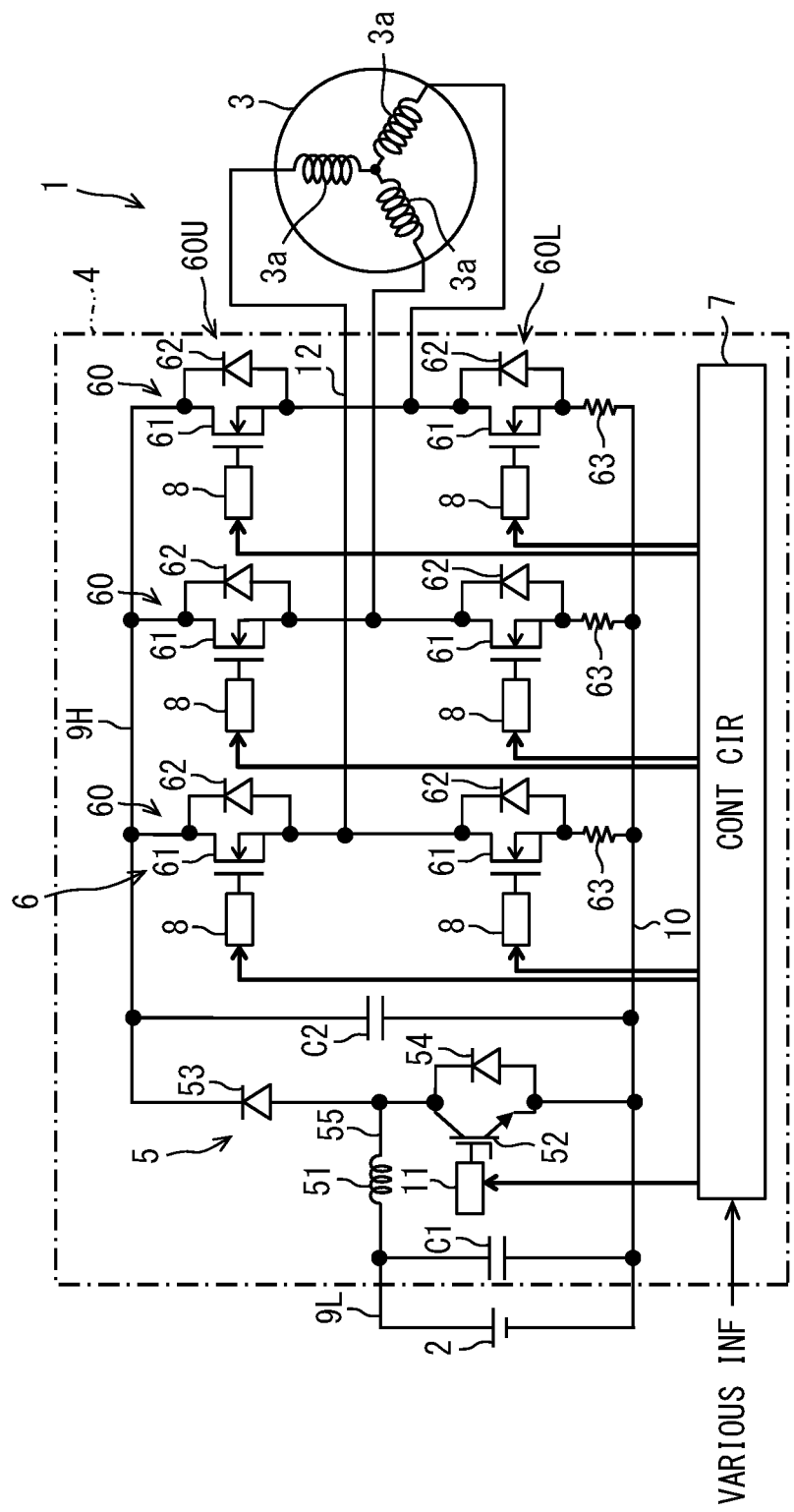
FIG. 1 is a diagram illustrating a circuit configuration of a power converter device to which a drive circuit according to a first embodiment is applied.

In a conceivable case of the MOSFET formed on the Si substrate, since the current is saturated, it is possible to determine whether an overcurrent is flowing, based on a predetermined overcurrent threshold. However, in the case of a switching element formed on a SiC substrate, there is a possibility that the overcurrent may not be detected. Thus, the switching element may not be appropriately protected from the overcurrent.

In view of the above points, a drive circuit is provided to appropriately protect a switching element from an overcurrent.

A drive circuit according to an example embodiment is a circuit for driving a switching element formed on a SiC substrate. The drive circuit includes a comparator a determination unit, a control unit, and a setting unit.

The comparator compares a current flowing through the switching element with an overcurrent threshold. The determination unit determines whether an overcurrent is flowing, based on the comparison result. The control unit generates a drive signal for controlling the drive operation of the switching element based on the drive command, and turns off the switching element when it is determined that the overcurrent is flowing. Then, the setting unit variably sets the overcurrent threshold variably according to a physical quantity correlated with the voltage between the main electrodes of the switching element.

In the case of the switching element formed on a SiC substrate, a current flowing through the switching element increases as the voltage between the main electrodes increases. The saturation current is not a constant value. According to the drive circuit, the overcurrent threshold can be variably set according to the physical quantity correlated with the voltage between the main electrodes of the switching element. Thus, the overcurrent threshold can be varied according to the voltage between the main electrodes. Thus, the overcurrent can be detected in a wide range of the voltage between the main electrodes. As a result, the switching element formed on the SiC substrate can be appropriately protected from the overcurrent.

Multiple embodiments will be described below with reference to the drawings. In the multiple embodiments, functionally and/or structurally corresponding parts are given the same reference numerals. The power converter device described below is applicable to vehicles such as a fuel cell vehicle (FCV), an electric vehicle (EV), and a hybrid vehicle (HV).

First Embodiment

First, a schematic configuration of a vehicle drive system to which a power converter device is applied will be described with reference to FIG. 1.

<Vehicle Drive System>

As shown in FIG. 1, a vehicle drive system 1 is provided with a DC power supply 2, a motor generator 3, and a power converter device 4.

The DC power supply 2 is a direct-current voltage source including a chargeable/dischargeable secondary battery. The secondary battery is, for example, a lithium ion battery or a nickel hydride battery. The motor generator 3 is a three-phase AC type rotating electric machine. The motor generator 3 functions as a vehicle driving power source, that is, an electric motor. The motor generator 3 functions also as a generator during regeneration. The power converter device 4 performs electric power conversion between the DC power supply 2 and the motor generator 3.

<Circuit Configuration of Power Converter Device>

Next, a circuit configuration of the power converter device 4 will be described with reference to FIG. 1. The power converter device 4 includes at least a power conversion unit. In the present embodiment, the power converter device 4 includes a filter capacitor C1, a smoothing capacitor C2, a converter 5, an inverter 6, a control circuit 7, and a drive circuit 8.

The filter capacitor C1 is connected between a VL line 9L, which is a power supply line connected to the positive electrode of the DC power supply 2, and an N line 10 connected to the negative electrode of the DC power supply 2. The N line 10 may be defined as a ground (GND) line. The filter capacitor C1 is connected in parallel to the DC power supply 2. The filter capacitor C1 removes a power supply noise from the DC power supply 2, for example. At least one of the VL line 9L and the N line 10 is provided with a system main relay (SMR) (not shown) between the DC power supply 2 and the filter capacitor C1.

The smoothing capacitor C2 is connected between the VH line 9H, which is a power supply line, and the N line 10. The smoothing capacitor C2 is arranged between the converter 5 and the inverter 6. The smoothing capacitor C2 is connected in parallel to the converter 5 and the inverter 6. The converter 5 is arranged between the VL line 9L and the VH line 9H, and the potential of the VH line 9H is equal to or higher than the potential of the VL line 9L.

The smoothing capacitor C2 smoothes the DC voltage boosted by the converter 5, for example, and accumulates the charge of the DC voltage. The voltage between both ends of the smoothing capacitor C2 provides a DC high voltage for driving the motor generator 3. The voltage between both ends of the smoothing capacitor C2 is equal to or higher than the voltage between both ends of the filter capacitor C1.

The converter 5 is a DC-DC converter that converts a DC voltage into a DC voltage having a different value. In the present embodiment, the converter 5 has a function of boosting the DC voltage supplied from the DC power supply 2. The converter 5 has a reactor 51, a switching element 52, and a diode 53 that is a rectifying element. In the present embodiment, an IGBT is employed as the switching element 52. A reflux diode 54 is connected in anti-parallel (i.e., reversely) to the switching element 52. Alternatively, instead of the IGBT, a MOSFET may be employed.

The switching element 52 and the diode 53 are connected in series between the VH line 9H and the N line 10 with arranging the diode 53 on the VH line 9H side. The switching element 52 (i.e., IGBT) has an emitter connected to the N line 10 and a collector connected to the anode of the diode 53. One end of the reactor 51 is connected via a boosting line 55 to a connection point between the emitter and the anode. The other end of reactor 51 is connected to the VL line 9L.

The converter 5 boosts a DC voltage supplied from the DC power supply 2 according to a switching control by the control circuit 7. The power converter device 4 includes a drive circuit 11 corresponding to the switching element 52. The drive circuit 11 supplies a drive voltage to the gate of the switching element 52 based on a drive command from the control circuit 7. The drive circuit 11 drives the switching element 52 to turn on and off by applying a drive voltage.

The inverter 6 is a DC-AC converter. The inverter 6 converts the DC voltage into a three-phase AC voltage according to the switching control by the control circuit 7 and outputs the three-phase AC voltage to the motor generator 3. Thereby, the motor generator 3 is driven to generate a predetermined torque.

The inverter 6 is configured to have upper and lower arm circuits 60 for three phases, respectively. The connection point of each upper and lower arm circuit 60 is connected to the corresponding phase winding 3a via the output line 12. The upper and lower arm circuit 60 has an upper arm 60U and a lower arm 60L. The upper arm 60U and the lower arm 60L are connected in series between the VH line 9H and the N line 10 with arranging the upper arm 60U on the VH line 9H side. The inverter 6 has six arms.

Each arm has a MOSFET 61 as a switching element and a diode 62. The diode 62 is connected in anti-parallel (i.e., reversely) to the MOSFET 61 for reflux. The diode 62 may be a parasitic diode (i.e., a body diode) of the MOSFET 61 or may be provided separately from the parasitic diode. The MOSFET 61 and the diode 62 are formed on a semiconductor substrate. In the present embodiment, the MOSFET 61 is an n-channel type. In the MOSFET 61, the drain is the main electrode on the high potential side, and the source is the main electrode on the low potential side. The MOSFET 61 is formed on a SiC (i.e., silicon carbide) substrate. The SiC has a larger band gap than Si (i.e., silicon).

In the upper arm 60U, the drain is connected to the VH line 9H. In the lower arm 60L, the source is connected to the N line 10. The source on the upper arm 60U side and the drain on the lower arm 60L side are connected to each other. The anode of the diode 62 is connected to the source of the corresponding MOSFET 61, and the cathode is connected to the drain.

Each of the upper and lower arm circuits 60 has a shunt resistor 63. By arranging the shunt resistor 63, the drive circuit 8 can detect an overcurrent as described later.

The control circuit 7 generates a drive command for operating the switching element 52 of the converter 5 and the MOSFET 61 of the inverter 6, and outputs the drive command to the drive circuits 8 and 11. The control circuit 7 generates the drive command based on a torque request input from a higher level ECU (not shown) and various information including signals detected by various sensors. Various sensors include, for example, a current sensor, a rotation angle sensor, and a voltage sensor.

The current sensor detects a phase current flowing through each phase winding 3a of the motor generator 3. Another current sensor is arranged on the boosting line 55 and detects a current flowing through the reactor L1. The rotation angle sensor detects the rotation angle of the rotor of the motor generator 3. The voltage sensor detects the voltage between both ends of the smoothing capacitor C2, that is, the voltage of the VH line 9H. Another voltage sensor detects the voltage across the filter capacitor C1, that is, the voltage on the VL line 9L.

The power converter device 4 includes these sensors (not shown). The control circuit 7 outputs a PWM signal as a drive command. The control circuit 7 includes, for example, a microcomputer (microcomputer). "ECU" is an abbreviation of "Electronic Control Unit". "PWM" is an abbreviation of "Pulse Width Modulation."

The drive command of the control circuit 7 is input to the drive circuit 8 via an insulating circuit (not shown) such as a photo coupler. The drive circuit 8 supplies a drive voltage to the gate of the MOSFET 61 of the corresponding arm based on the drive command. The drive circuit 8 drives the corresponding MOSFET 61 by applying a drive voltage to turn on and off the drive of the corresponding MOSFET 61. The drive circuit 8 is also defined as a driver. In the present embodiment, one drive circuit 8 is arranged for one arm.

Note that the converter 5 described above may have a step-down function. By changing the rectifying element from the diode 53 to a switching element, a step-up/step-down function can be provided. At the time of regenerative braking of the vehicle, the inverter 6 converts the three-phase AC voltage generated by the motor generator 3 by receiving the rotational force from the wheels into a DC voltage according to the switching control by the control circuit 7, and outputs the DC voltage to the VH line 9H. The converter 5 steps down the voltage of the VH line 9H and charges the DC power supply 2 according to the switching control by the control circuit 7. In addition to the converter 5 and the DC power supply 2, a step-down converter and a DC power supply (not shown) may be provided.

<Drive Circuit>

Figure 2:
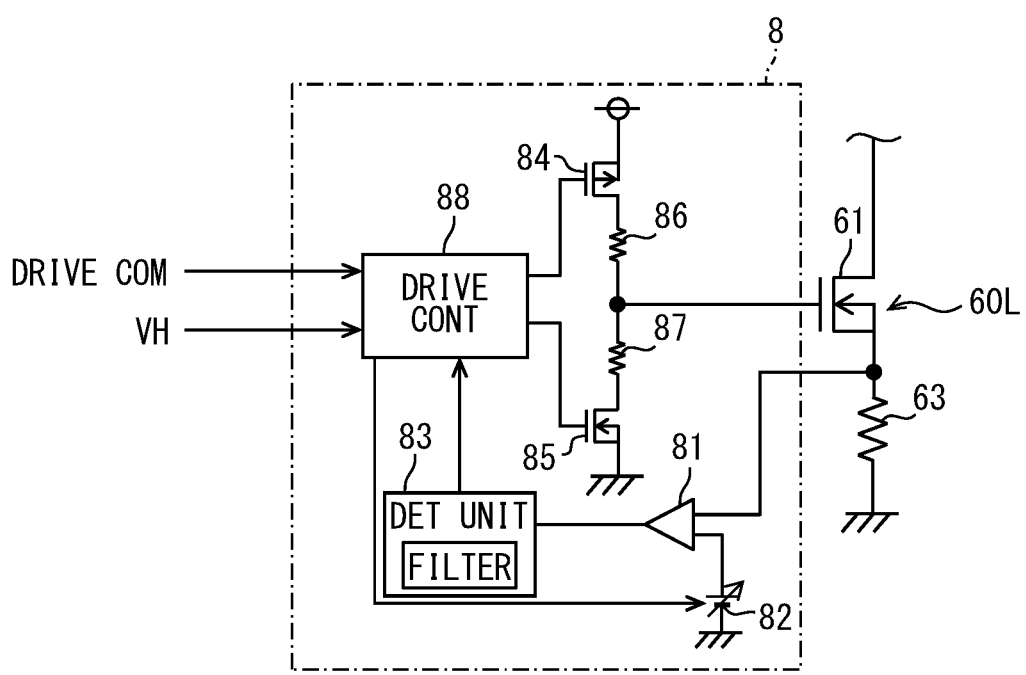
FIG. 2 is a diagram illustrating a drive circuit.

Next, the drive circuit 8 will be described with reference to FIG. 2. FIG. 2 shows the drive circuit 8 on the lower arm 60L side. The drive circuit 8 on the upper arm 60U side has the same configuration.

As shown in FIG. 2, the drive circuit 8 includes a comparator 81, a variable power supply 82, a determination unit 83, an on-state switch 84, an off-state switch 85, and a drive control unit 88.

One of the input terminals of the comparator 81 receives the terminal voltage on the high potential side of the shunt resistor 63. An overcurrent threshold (i.e., a reference voltage) is input to another one of the input terminals. The comparator 81 compares the voltage between both ends of the shunt resistor 63 with the overcurrent threshold, and outputs the comparison result. In the present embodiment, the comparator 81 outputs "1" when the voltage across the shunt resistor 63, i.e., the current flowing through the MOSFET 61 is equal to or greater than the overcurrent threshold, and outputs "0" when the voltage is less than the overcurrent threshold. The comparator 81 corresponds to a comparison unit. The comparator 81, together with the shunt resistor 63, constitutes a current detection unit that detects a current flowing through the MOSFET 61.

The variable power supply 82 is a power supply that varies a reference voltage that is an overcurrent threshold. The variable power supply 82 generates an overcurrent threshold according to the setting signal output from the drive control unit 88 and outputs the threshold to an input terminal of the comparator 81.

The determination unit 83 determines whether an overcurrent is flowing based on the output of the comparator 81. The determination unit 83 has a filter function. When the output of the comparator 81 switches from "0" to "1" and the state of "1" continues for a predetermined filter time, the determination unit 83 determines that an overcurrent flows. The determination unit 83 outputs a signal indicating the determination result to the drive control unit 88.

The on-state switch 84 is arranged between the power supply and the gate of the MOSFET 61. In the present embodiment, the on-state switch 84 is a p-channel MOSFET. The source of the on-state switch 84 is connected to the power supply. The drain of the on-state switch 84 is connected to the gate of the MOSFET 61 via the resistor 86. The on-state switch 84 may be referred to as a charging switch.

The off-state switch 85 is arranged between the ground and the gate of the MOSFET 61. In the present embodiment, the off-state switch 85 is a n-channel MOSFET. The source of the off-state switch 85 is connected to the ground. The drain of the off-state switch 85 is connected to the gate of the MOSFET 61 via the resistor 87. The off-state switch 85 may be referred to as a discharging switch. Hereinafter, the on-state switch 84 and the off-state switch 85 may be simply referred to as switches 84 and 85.

The switches 84 and 85 are connected in series between the power supply and the ground (i.e., GND). The drains of the switches 84 and 85 are connected to each other. The gate of the MOSFET 61 is connected to the connection point between the switches 84 and 85. A resistor 86 is provided between the connection point of the switches 84 and 85 and the on-state switch 84, and a resistor 87 is provided between the connection point and the off-state switch 85.

A drive command is input to the drive control unit 88 from the control circuit 7 via an insulating circuit (not shown). The drive control unit 88 controls to drive the switches 84 and 85 based on a drive command that is a PWM signal.

When the drive command is at the L (i.e., low) level, the drive control unit 88 turns on the on-state switch 84 and turns off the off-state switch 85. As a result, a first path is formed between the power supply and the gate of the MOSFET 61 via the on-state switch 84 and the resistor 86. At the time of turn-on, a current flows from the power supply to the gate of the MOSFET 61, and the gate is charged.

When the drive command is at the H (i.e., high) level, the drive control unit 88 turns off the on-state switch 84 and turns on the off-state switch 85. As a result, a second path is formed between the ground and the gate of the MOSFET 61 via the off-state switch 85 and the resistor 87. At the time of turn-off, a current flows from the gate of the MOSFET 61 to the ground, and the charge of the gate is extracted (i.e., discharged).

The turn-off drive command for turning off the MOSFET 61 is an H level signal. The turn-on drive command for turning on MOSFET 61 is a signal having a predetermined duty ratio. When a positive voltage is applied as a drive voltage to turn on the MOSFET 61, the first path is formed as described above.

Note that the drive circuit 8 may include a negative voltage source (not shown) to apply a negative voltage instead of 0 V (zero) to the gate when turning off the MOSFET 61. According to this, erroneous firing (i.e., turning-on) of MOSFET 61 can be suppressed.

The determination signal of the determination unit 83 is input to the drive control unit 88. When the determination unit 83 determines that an overcurrent occurs, the drive control unit 88 forcibly turns off the MOSFET 61 regardless of the drive command. For example, when a short-circuit or an on-state fixation occurs between the main electrodes of the MOSFET 61 in the upper arm 60U, which is the opposing arm, an upper and lower short-circuit occurs due to the turn-on drive of the MOSFET 61 constituting the lower arm 60L. According to the present embodiment, an overcurrent due to an upper and lower short circuit is detected, and the MOSFET 61 in the lower arm 60L is turned off. Thereby, the MOSFET 61 can be protected from the overcurrent.

A VH signal is further input to the drive control unit 88. As described above, the VH signal is the voltage of the VH line 9H detected by the voltage sensor (not shown). Hereinafter, the voltage of VH line 9H may be simply referred to as a voltage VH. In the present embodiment, the VH signal is input from the control circuit 7 via the insulation circuit. The voltage VH is a physical quantity that correlates to the drain-source voltage Vds of the MOSFET 61. When the voltage VH increases, the voltage Vds also increases, and when the voltage VH decreases, the voltage Vds also decreases.

The drive control unit 88 outputs a setting signal of the overcurrent threshold to the variable power supply 82 such that the overcurrent threshold has a value corresponding to the VH signal, that is, a value corresponding to the voltage Vds. The variable power supply 82 sets an overcurrent threshold according to the setting signal. The drive control unit 88 increases the overcurrent threshold when the voltage VH increases, and decreases the overcurrent threshold when the voltage VH decreases. The drive control unit 88 corresponds to a control unit and a setting unit.

Figure 3:
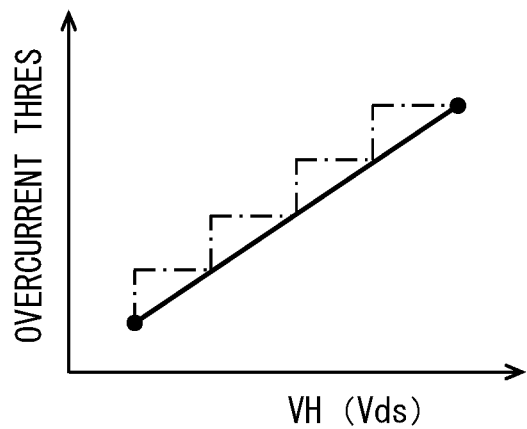
FIG. 3 is a diagram showing a relationship between a voltage VH and an overcurrent threshold.

As shown by the solid line in FIG. 3, the drive control unit 88 may continuously set the overcurrent threshold according to the voltage VH. Further, as indicated by a dashed line in FIG. 3, the drive control unit 88 may set the overcurrent threshold in a stepwise manner according to the voltage VH. The relationship between the voltage VH and the overcurrent threshold is given by a map or a function.

Figure 4:
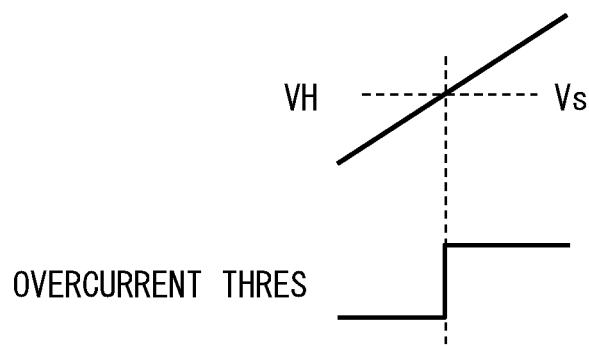
FIG. 4 is a diagram showing a switching operation of the overcurrent threshold.

FIG. 4 shows an example in which the overcurrent threshold is switched in two stages. When the voltage VH increases and becomes equal to or higher than the reference voltage Vs, the drive control unit 88 switches the setting of the overcurrent threshold from the first threshold to a second threshold that is larger than the first threshold. When the voltage VH falls and becomes lower than the reference voltage Vs, the drive control unit 88 switches the setting of the overcurrent threshold from the second threshold to the first threshold smaller than the second threshold.

Figure 5:
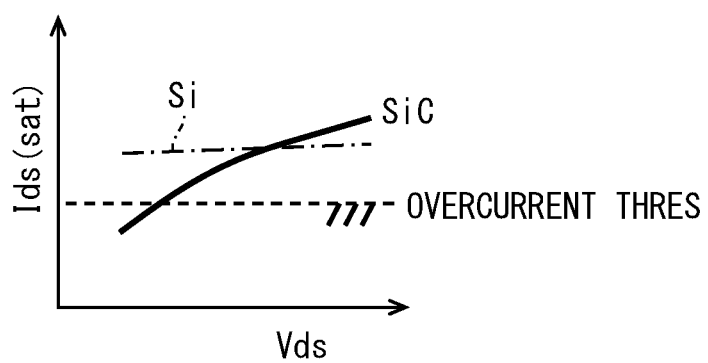
FIG. 5 is a reference diagram when an overcurrent threshold is set to a fixed value.

FIG. 5 is a reference diagram showing the relationship between the voltage Vds and the saturation current Ids(sat). In FIG. 5, the characteristics of the MOSFET formed on the SiC substrate are indicated by the solid line, and the characteristics of the MOSFET formed on the Si substrate are indicated by the dashed line.

In the case of Si, when the drive voltage applied to the gate of the MOSFET is constant, the saturation current Ids(sat) hardly changes in the operating range of the voltage Vds. Therefore, an overcurrent can be detected based on a predetermined overcurrent threshold (that is a fixed value). On the other hand, in the case of SiC, the saturation current Ids(sat) changes according to the voltage Vds. As the voltage Vds increases, the saturation current Ids(sat) also increases. If a fixed value is used as the overcurrent threshold, for example, when the voltage Vds is low in the operating voltage range, the overcurrent cannot be detected.

On the other hand, according to the drive circuit 8 of the present embodiment, the overcurrent threshold can be variably set according to the physical quantity correlated with the voltage Vds of the MOSFET 61 formed on the SiC substrate. Thus, the overcurrent threshold can be switched according to the physical quantity. Therefore, the overcurrent can be detected in a wide range of the voltage Vds. As a result, the MOSFET 61 formed on the SiC substrate can be appropriately protected from the overcurrent.

In particular, in the present embodiment, the voltage VH of the VH line 9H is used as the correlated physical quantity. As described above, the voltage VH is a physical quantity used when the control circuit 7 generates a drive command. Since a physical quantity used for the control is used, overcurrent can be detected in a wide range of the voltage Vds while suppressing the complex design of the circuit configuration.

The voltage VL may be used instead of the voltage VH. The voltage VL is a voltage of the VL line 9L detected by a voltage sensor (not shown). The voltage VL is also a physical quantity used when the control circuit 7 generates a drive command. Therefore, the overcurrent can be detected in a wide range of the voltage Vds while suppressing the complexity of the circuit configuration. Note that information on the voltages VH and VL may be superimposed on the drive command. According to this, the number of signal inputs to the insulating circuit and the drive circuit 8 can be reduced.

As shown in FIG. 3, the overcurrent threshold may be set continuously. Also, the setting may be made in three or more steps. According to this, the overcurrent can be detected with higher accuracy.

Second Embodiment

The second embodiment is a modification of a precedent embodiment as a basic configuration and may incorporate description of the precedent embodiment.

Figure 6:
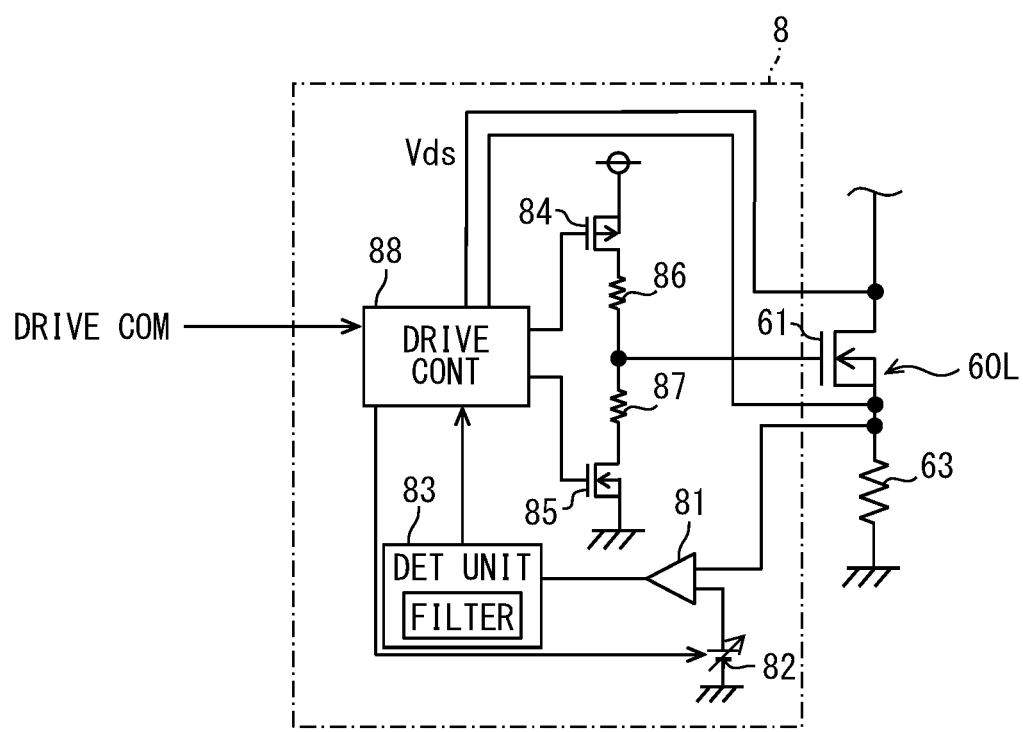
FIG. 6 is a diagram illustrating a drive circuit according to a second embodiment.

FIG. 6 shows the drive circuit 8 of the present embodiment. FIG. 6 corresponds to FIG. 2 and shows the drive circuit 8 on the lower arm 60L side. Similar to the previous embodiment, the drive circuit 8 on the upper arm 60U has the same configuration as that on the lower arm 60L. The drive control unit 88 obtains the voltage Vds between the drain and the source of the MOSFET 61. The drive control unit 88 sets an overcurrent threshold according to the voltage Vds. Other structures are similar to those in the precedent embodiment. The function of detecting the voltage Vds of the amplifier or the like may be provided by the drive control unit 88. A configuration may be adopted such that a voltage detection unit is provided separately from the drive control unit 88 and a detection signal is output to the drive control unit 88.

According to the present embodiment, the drive circuit 8 detects the voltage Vds for setting the overcurrent threshold. Since the voltage Vds is directly detected, an overcurrent threshold corresponding to the voltage Vds can be appropriately set.

Third Embodiment

The second embodiment is a modification of a precedent embodiment as a basic configuration and may incorporate description of the precedent embodiment.

Figure 7:
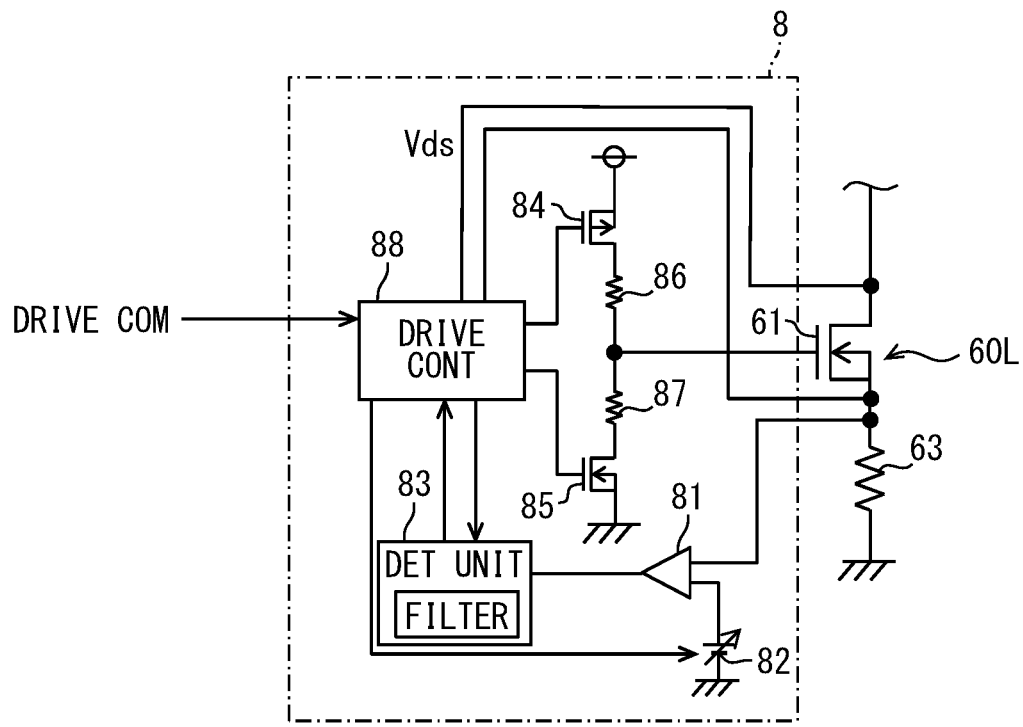
FIG. 7 is a diagram illustrating a drive circuit according to a third embodiment.

FIG. 7 shows the drive circuit 8 of the present embodiment. FIG. 7 corresponds to FIG. 2 and shows the drive circuit 8 on the lower arm 60L side. Similar to the previous embodiment, the drive circuit 8 on the upper arm 60U has the same configuration as that on the lower arm 60L. As described above, the determination unit 83 has a filter function. The drive control unit 88 variably sets the filtering time tf of the determination unit 83 according to the physical quantity.

Figure 8:
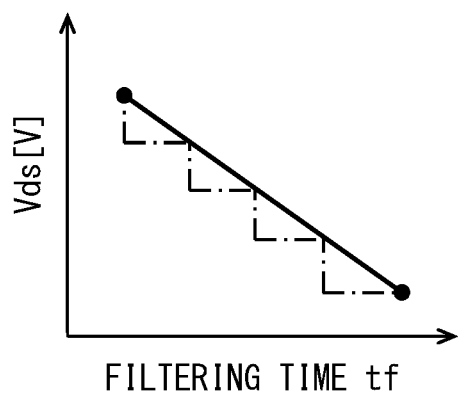
FIG. 8 is a diagram illustrating a relationship between a filter time tf and a voltage Vds.

FIG. 8 shows the relationship between the filtering time tf and the voltage Vds. When the voltage Vds decreases, the drive control unit 88 increases the filtering time tf. When the voltage Vds increases, the drive control unit 88 shortens the filtering time tf. As shown by the solid line in FIG. 8, the drive control unit 88 may continuously set the filtering time tf according to the voltage Vds. Alternatively, as indicated by a dashed line in FIG. 3, the drive control unit 88 may set the filtering time tf in a stepwise manner according to the voltage Vds. The relationship between voltage Vds and filtering time tf is given by a map or a function.

According to the drive circuit 14 of the present embodiment, the filtering time tf until the overcurrent is determined can be set according to the voltage Vds. In particular, when the voltage Vds decreases, the filtering time tf is lengthened, so that it is possible to suppress a decrease in the accuracy of overcurrent detection. In other words, erroneous detection of the overcurrent can be suppressed. Further, when the voltage Vds increases, the filtering time tf is shortened, so that the time required for determining the overcurrent can be shortened.

Although the example of the voltage Vds is described as a physical quantity, it is not limited to this. The voltages VH and VL described in the preceding embodiment may be used.

Other Embodiments

The disclosure in this specification and drawings etc. is not limited to the exemplified embodiment. The present disclosure encompasses the illustrated embodiments and modifications based on the embodiments by those skilled in the art. For example, the disclosure is not limited to the combinations of parts and/or elements shown in the embodiments. The present disclosure may be implemented in various combinations. The disclosure may have additional parts that may be added to the embodiment. The disclosure covers omissions of parts and/or elements of the embodiments. The disclosure covers replacement or combination of components, elements between one embodiment and another. The disclosed technical scope is not limited to the description of the embodiments.

The control circuit 7 and the drive circuit 8 are provided by a control system including at least one computer. The computer includes at least one processor (hardware processor) that is hardware. The hardware processor may be provided by the following (i), (ii), or (iii).

(i) The hardware processor may be a hardware logic circuit. In this case, the computer is provided by a digital circuit including a number of programmed logic units (gate circuits). The digital circuit may comprise a memory for storing programs and/or data. The computer may be provided by an analog circuit. A computer may be provided by a combination of a digital circuit and an analog circuit.

(ii) The hardware processor may be at least one processor core that executes a program stored in at least one memory. In this case, the computer is provided by at least one memory and at least one processor core. The processor core is called, for example, a CPU. The memory is also called a storage medium. The memory is a non-transitory and tangible storage medium, which non-temporarily stores a program and/or data readable by the processor.

(iii) The hardware processor may be a combination of the above (i) and the above (ii). (i) and (ii) are placed on different chips or on a common chip.

That is, the means and/or functions provided by the control circuit 7 and the drive circuit 8 can be provided by hardware only, software only, or a combination thereof.

Although the example is described such that the drive circuit 8 is adopted to the MOSFET 61 (i.e., the switching element) configuring the upper and lower arm circuits 60, the present disclosure is not limited to this. The present disclosure may also be adopted to a power converter device 4 that does not include the filter capacitor C1 and the converter 5. The present disclosure may also be adopted to a switching element constituting the converter 5. Although the example is described such that the power converter device 4 is adopted to the drive system 1, the present disclosure is not limited to this.

The timing for setting the overcurrent threshold by the drive control unit 88 may not be particularly limited. The drive control unit 88 may read a physical quantity at predetermined intervals, for example, and output a setting signal corresponding to the physical quantity to the variable power supply 82. Alternatively, the drive control unit 88 may execute the setting process of the overcurrent threshold using the switching operation of another signal as a trigger. The drive control unit 88 acquires a physical quantity at a timing when the drive command is switched from an turn-on drive command to an turn-off drive command, for example. Then, at the timing of switching from the turn-off drive command to the turn-on drive command, the setting of the overcurrent threshold according to the acquired physical quantity may be executed.

Although the example is described such that the current is detected by the shunt resistor 63, the present disclosure is not limited to this. For example, on the same semiconductor substrate as the MOSFET 61, a sensing element having the same structure as the MOSFET 61 and an area of about $\frac{1}{1000}$ to $\frac{1}{10000}$ of the MOSFET 61 is arranged. Then, the current flowing through the sense element may be detected.

The controllers and methods described in the present disclosure may be implemented by a special purpose computer created by configuring a memory and a processor programmed to execute one or more particular functions embodied in computer programs. Alternatively, the controllers and methods described in the present disclosure may be implemented by a special purpose computer created by configuring a processor provided by one or more special purpose hardware logic circuits. Alternatively, the controllers and methods described in the present disclosure may be implemented by one or more special purpose computers created by configuring a combination of a memory and a processor programmed to execute one or more particular functions and a processor provided by one or more hardware logic circuits. The computer programs may be stored, as instructions being executed by a computer, in a tangible non-transitory computer-readable medium.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A drive circuit for driving a switching element formed on a SiC substrate, the drive circuit comprising:
   a comparator for comparing a current flowing through the switching element with an overcurrent threshold;
   a determination unit for determining whether an overcurrent flows, based on a comparison result; and
   a drive control unit for:
      generating a drive signal for controlling a drive operation of the switching element based on a drive command, and for turning off the switching element when determining that the overcurrent flows; and
      variably setting the overcurrent threshold according to a physical quantity correlated with a voltage between main electrodes of the switching element.

2. The drive circuit according to claim 1, wherein:
   the physical quantity is a voltage of a power supply line connecting a circuit including the switching element and a DC power supply.

3. The drive circuit according to claim 1, wherein:
   the physical quantity is a voltage between main electrodes of the switching element.

4. The drive circuit according to claim 2, wherein:
   the drive control unit increases the overcurrent threshold when a voltage as the physical quantity increases; and
   the drive control unit decreases the overcurrent threshold when the voltage decreases.

5. The drive circuit according to claim 1, wherein:
the determination unit determines that the overcurrent flows when the comparison result continues for a predetermined time that the current is equal to or more than the overcurrent threshold; and
the drive control unit variably sets the predetermined time according to the physical quantity; and
the drive control unit lengthens the predetermined time when the physical quantity decreases.

6. The drive circuit according to claim 1, wherein:
the drive control unit sets the overcurrent threshold continuously or in a stepwise manner.

7. A drive circuit for driving a switching element formed on a SiC substrate, the drive circuit comprising:
a comparator for comparing a current flowing through the switching element with an overcurrent threshold;
a processor programmed to:
determine whether an overcurrent flows, based on a comparison result;
generate a drive signal for controlling a drive operation of the switching element based on a drive command, and turn off the switching element when determining that the overcurrent flows; and
variably set the overcurrent threshold according to a physical quantity correlated with a voltage between main electrodes of the switching element.

8. The drive circuit according to claim 7, wherein:
the physical quantity is a voltage of a power supply line connecting a circuit including the switching element and a DC power supply.

9. The drive circuit according to claim 7, wherein:
the physical quantity is a voltage between main electrodes of the switching element.

10. The drive circuit according to claim 8, wherein the processor is programmed to:
increase the overcurrent threshold when a voltage as the physical quantity increases; and
decrease the overcurrent threshold when the voltage decreases.

11. The drive circuit according to claim 7, wherein the processor is programmed to:
determine that the overcurrent flows when the comparison result continues for a predetermined time that the current is equal to or more than the overcurrent threshold; and
variably set the predetermined time according to the physical quantity; and
lengthen the predetermined time when the physical quantity decreases.

12. The drive circuit according to claim 7, wherein the processor is programmed to:
set the overcurrent threshold continuously or in a stepwise manner.

* * * * *